United States Patent [19]

Sumida

[11] Patent Number: 5,915,994
[45] Date of Patent: Jun. 29, 1999

[54] CONNECTOR FOR USE WITH PRINTED CIRCUIT AND ADDED COMPONENT

[75] Inventor: Yoshitaka Sumida, Nagoya, Japan

[73] Assignees: Harness System Technologies Research, Ltd., Nagoya, Japan; Sumitomo Wiring Systems, Ltd., Mie, Japan; Sumitomo Electric Industries, Ltd., Osaka, Japan

[21] Appl. No.: 08/999,262

[22] Filed: Dec. 29, 1997

[30] Foreign Application Priority Data

Jan. 16, 1997 [JP] Japan .................................. 9-005424

[51] Int. Cl.⁶ .................................................. H01R 13/66

[52] U.S. Cl. ........................................................... 439/620

[58] Field of Search ............................... 439/79, 80, 620; 361/760

[56] References Cited

U.S. PATENT DOCUMENTS 5,148,354  9/1992  Roth ......................................... 361/760

FOREIGN PATENT DOCUMENTS

A-59-181913  10/1984  Japan .

Primary Examiner—Neil Abrams
Attorney, Agent, or Firm—Oliff & Berridge, PLC

[57] ABSTRACT

A wiring structure comprises a connector and an electromagnetic relay mounted on a printed circuit board. Connector terminals extend respectively to lead terminals of the electromagnetic relay. Through holes formed respectively through distal end portions of the connector terminals and, are aligned respectively with through holes in the printed circuit board in an overlying manner, and each of the lead terminals of the electromagnetic relay is passed through the associated mating pair of aligned through holes, and is fixed thereto by soldering.

8 Claims, 4 Drawing Sheets

5,915,994

CONNECTOR FOR USE WITH PRINTED CIRCUIT AND ADDED COMPONENT

BACKGROUND OF THE INVENTION

This invention relates to a connector electrically connected to a mounted part on a printed circuit board, and also relates to a wiring structure including this connector. More specifically, the invention relates to a connector suited for a mounted part, such as a relay, a power transistor and a power supply diode, through which a large current flows, and also relates to a wiring structure including this connector.

One conventional wiring structure of the type described is shown in FIGS. 9 and 10.

In this wiring structure, a connector 210 and an electromagnetic relay 220 are mounted on a printed circuit board 202 having predetermined wiring patterns 204 and 206 formed thereon. Connector terminals 212b of the connector 210 for a control system and leads terminals 222b of the electromagnetic relay 220 for a control system are soldered respectively to the wiring patterns 206, thereby forming a predetermined control circuit. Connector terminals 212a of the connector 210 for a drive system and lead terminals 222a of the electromagnetic relay 220 for a drive system are soldered respectively to the wiring patterns 204, and the terminals 212a are electrically connected respectively to the terminals 222a through the respective wiring patterns 202. With this arrangement, an external load (not shown), connected to the connector 210, can be driven and controlled by the electromagnetic relay 220.

Usually, the connector terminals 212a are formed by blanking a metal sheet, and have a predetermined thickness corresponding to a load current. On the other hand, the wiring patterns 204 and 206 are formed of a copper foil or the like, and are extremely thinner than the connector terminals 212a, and therefore need to have respective predetermined widths corresponding to the load current.

Therefore, the wiring patterns 204 (each forming a current-flowing path between the connector terminal 212a and the lead terminal 222a), through which a load drive current, larger than a current flowing through the other wiring patterns 206, flows, need to be wider than the wiring patterns 206.

However, if the wiring patterns 204 are formed into a predetermined width corresponding to the value of the energizing current to be passed through these wiring patterns 204, the area of the wiring patterns 204 increases if the value of this energizing current is large, and this greatly limits the design of the printed circuit board.

SUMMARY OF THE INVENTION

The present invention has been made in order to overcome the above problem, and an object of the invention is to provide a connector which can be electrically connected to a mounted part (particularly a mounted part, such as a relay, a power transistor and a power supply diode, supplied with a large current) on a printed circuit board in a small space, and another object of the invention is to provide a wiring structure including such a connector.

To solve the above problem, the present invention provides a connector in that through holes for respectively passing lead terminals of a mounted part therethrough are formed respectively through distal end portions of connector terminals extending from a connector body.

The invention also provides a wiring structure for electrically connecting a mounted part and a connector, which are mounted respectively on predetermined portions of a printed circuit board, together; in that through holes for respectively passing lead terminals of the mounted part therethrough are formed through the printed circuit board; connector terminals of the connector extend respectively to positions where the through holes in the printed circuit board are located, respectively, and through holes, formed respectively through distal end portions of the connector terminals, are aligned respectively with the through holes in the printed circuit board in an overlying manner; and each of the lead terminals is passed through the associated mating pair of aligned through holes, and is soldered thereto, thereby electrically connecting the lead terminal and the connector terminal together.

BRIEF DESCRIPTION OF THE PREFERRED EMBODIMENTS

DETAILED DESCRIPTION OF THE PREFERRED EMBODIMENTS

One preferred embodiment of a wiring structure of the present invention will now be described.

Figure 1:
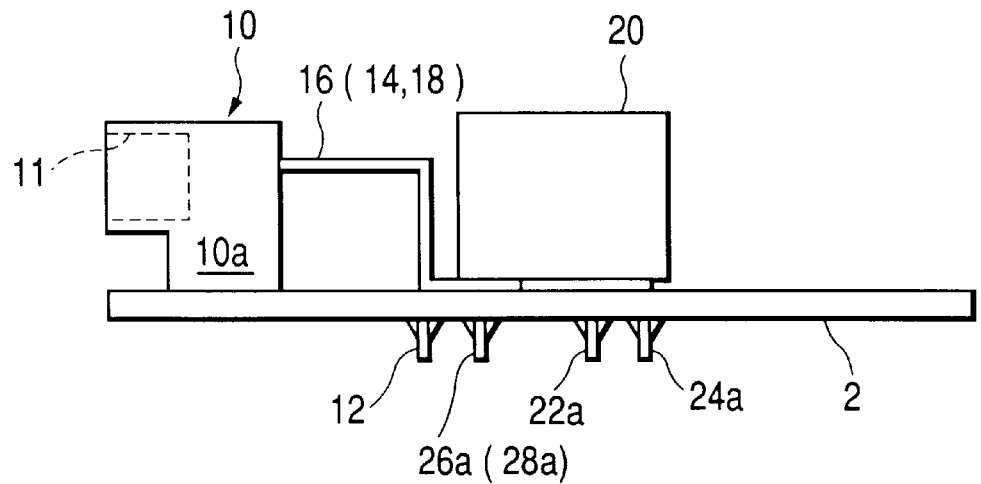
FIG. 1 is a side-elevational view showing a first embodiment of a wiring structure of the present invention.
Figure 2:
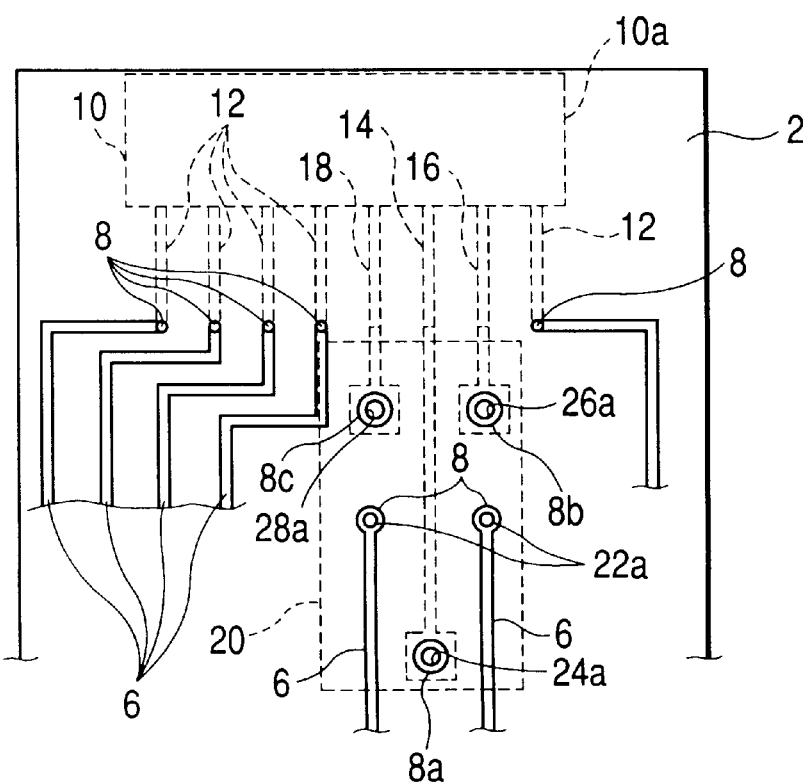
FIG. 2 is a bottom view of the wiring structure.
Figure 3:
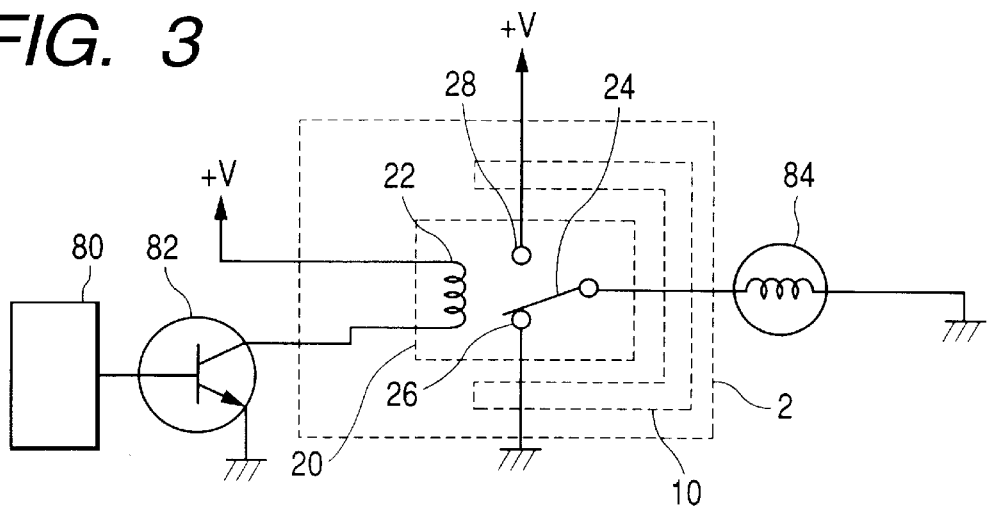
FIG. 3 is a circuit diagram of the wiring structure.

As shown in FIGS. 1 to 3, this wiring structure constitutes part of a drive control circuit of a load 84 such as a lamp. More specifically, an electromagnetic relay 20 and a connector 10 are mounted respectively on predetermined portions of a printed circuit board 2. Contacts 24, 26 and 28 of the electromagnetic relay 20 are electrically connected respectively to one end of the external load 84, the ground and a power source through the connector 10. Opposite ends of an exciting coil 22 are electrically connected respectively to a collector of an external transistor 82 and the power source through another connector (not shown). An emitter of the transistor 82 is connected to the ground, and a control signal is inputted from a control portion 80 into a base of this transistor. Therefore, the transistor 82 is turned on and off by the control portion 80 to energize and de-energize the exciting coil 22 so as to shift the movable contact 24 between the contact 26 and the contact 28, thereby controlling the energization of the load 84.

Predetermined wiring patterns 6 are formed on a reverse side of the printed circuit board 2, and through holes 8, 8a, 8b and 8c are formed at predetermined portions of the printed circuit board 2 where the connector 10 and the electromagnetic relay 20 are mounted.

Figure 4:
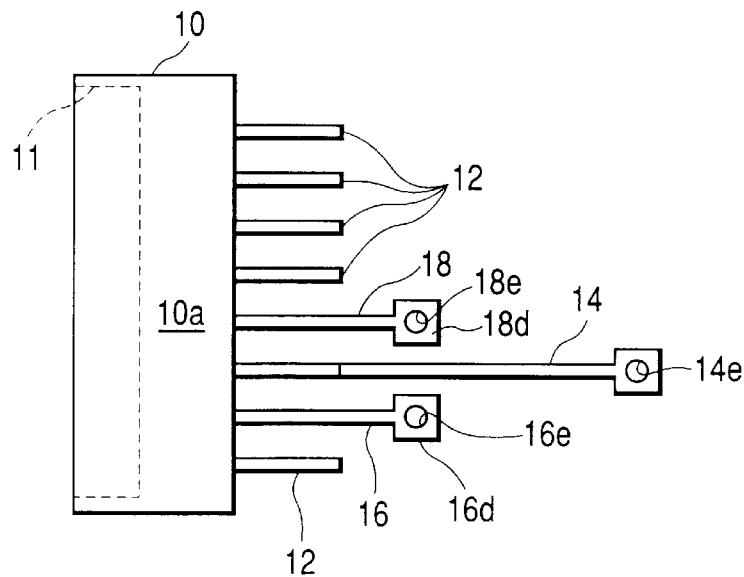
FIG. 4 is a plan view of a connector.

As shown in FIGS. 1 and 4, the connector 10 has a connector portion 11 provided at a front side of a connector body 10a, and an external connector (not shown), connected to the load 84 and the power source, is connected to this connection portion 11. Connector terminals 12, 14, 16 and 18 extend from a rear side of the connector body 10a.

Figure 5:
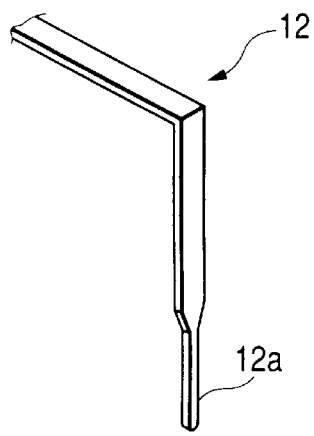
FIG. 5 is a perspective view of a connector terminal.

As shown in FIG. 5, each of the connector terminals 12 is formed into a generally inverted L-shape, and its distal end portion is formed into a narrow insertion portion 12a. The insertion portions 12a of the connector terminals 12 are passed respectively through the through holes 8, and are soldered respectively to the wiring patterns 6.

Figure 6:
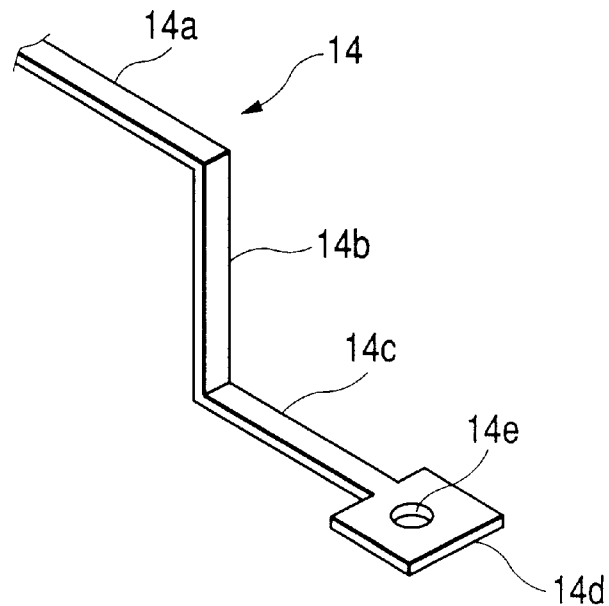
FIG. 6 is a perspective view of another connector terminal.

The connector terminal 14 is formed by blanking a metal piece from a metal sheet and then by bending this metal piece, and the connector terminal 14 has a predetermined thickness. As shown in FIG. 6, the connector terminal 14 has a horizontal portion 14a extending from the rear side of the connector 10 toward the electromagnetic relay 20, a vertical portion 14b extending downwardly from a distal end of the horizontal portion 14a toward the upper surface of the printed circuit board 2, and an extension portion 14c extending from a lower end of the vertical portion 14b toward a lead terminal 24a (described later) of the electromagnetic relay 20 along the upper surface of the printed circuit board 2. Further, a flat plate portion 14d of a square shape is formed at a distal end of the extension portion 14c, and a through hole 14e is formed through a central portion of the flat plate portion 14d. In a condition in which the connector 10 is mounted on the printed circuit board 2, the flat plate portion 14d, formed at the distal end of the connector terminal 14, is disposed at a position where the lead terminal 24a of the electromagnetic relay 20 is located, and at this position the through hole 14e is aligned with the through hole 8a in the printed circuit board 2 in overlying relation thereto.

The connector terminals 16 and 18 have the same construction as that of the connector terminal 14, and in the condition in which the connector 10 is mounted on the printed circuit board 2, flat plate portions 16d and 18d, formed respectively at distal ends of the connector terminals 16 and 18, are disposed respectively at positions where lead terminals 26a and 28a of the electromagnetic relay 10 are located, respectively, and at these positions, through holes 16e and 18e are aligned respectively with the through holes 8b and 8c in the printed circuit board 2 in an overlying manner.

A pair of lead terminals 22a, connected to the exciting coil 22, and the lead terminals 24a, 26a and 28a, connected respectively to the contacts 24, 26 and 28, extend downwardly from the lower side of the electromagnetic relay 20.

The lead terminals 22 are passed respectively through the associated through holes 8, and are soldered respectively to the wiring patterns 6, and are electrically connected respectively to the collector of the transistor 82 and the power source.

Figure 7:
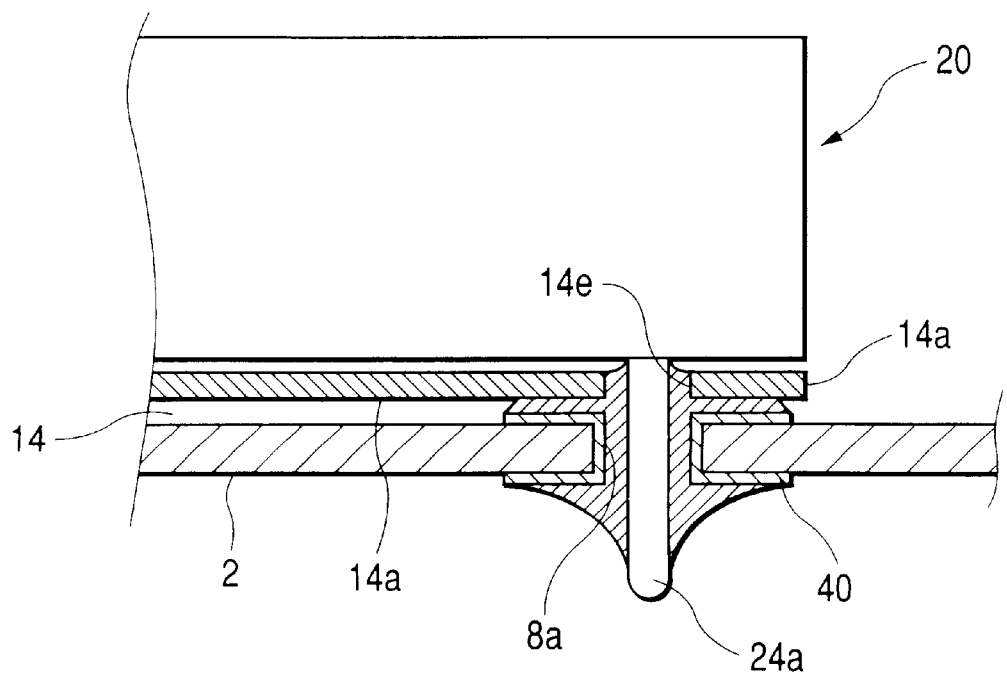
FIG. 7 is an enlarged, cross-sectional view of an important portion of the wiring structure.

As shown in FIG. 7, a land portion 40 is provided at the through hole 8a through which the lead terminal 24a is passed, and this land portion 40 covers an inner peripheral surface of the through hole 8a and the upper and lower surfaces of the printed circuit board 2 at the opposite ends of the through hole 8a. The flat plate portion 14d of the connector terminal 14 is laid over the land portion 40, and in this condition the lead terminal 24a of the electromagnetic relay 20 is passed through the through holes 14e and 8e from the upper side, and is soldered to the wiring pattern. With this arrangement, the lead terminal 24a is electrically connected to the connector terminal 14.

Similarly, the lead terminal 26a is electrically connected to the flat plate portion 16d of the connector terminal 16, and the lead terminal 28a is electrically connected to the flat plate portion 18d of the connector terminal 18. With this arrangement, the contacts 24, 26 and 28 of the electromagnetic relay 20 are electrically connected respectively to the external load 84, the ground and the power source through the connector 10.

Figure 10:
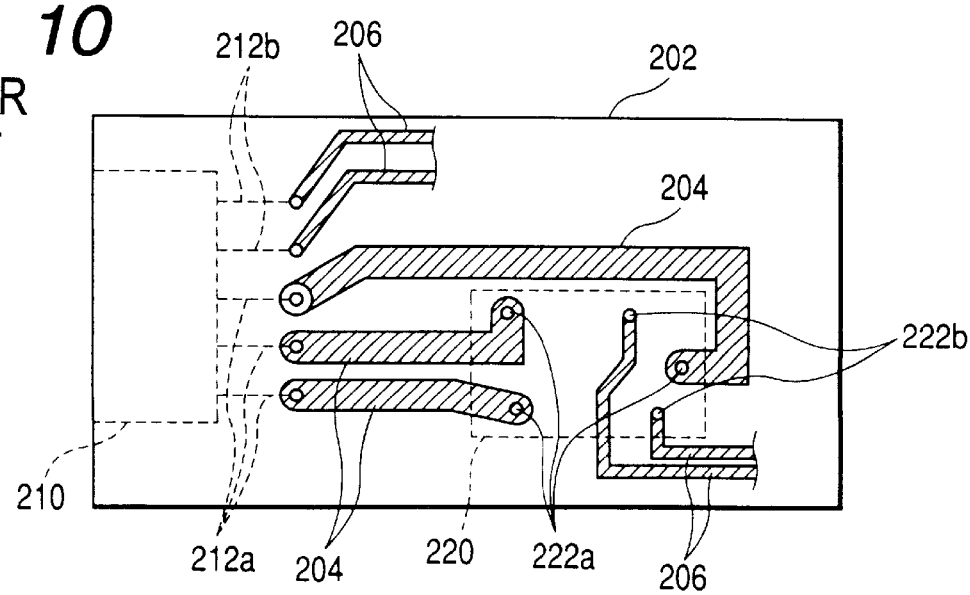
FIG. 10 is a bottom view of the conventional wiring structure.

In the above mentioned wiring structure, the control-side circuit (through which a small current flows) of the drive control circuit of the load 84 on the printed circuit board 2 is constituted by the wiring patterns 6 while the drive-side circuit (through which a large current flows) of the drive control circuit is constituted by the connector terminals 14, 16 and 18 extending respectively to the lead terminals 24a, 26a and 28a. Therefore, the width of the connector terminals 14, 16 and 18 can be made smaller than the width of the wiring patterns 204 of the conventional construction shown in FIG. 10. As a result, a space available on the printed circuit board can be effectively used, and besides the degree of freedom of the design is increased.

The through holes 14e, 16e and 18e, formed respectively in the connector terminals 14, 16 and 18 are aligned respectively with the through holes 8a, 8b and 8c in the printed circuit board 2 in an overlying manner, and the lead terminals 24a, 26a and 28a are passed through the respective aligned through holes, and are soldered thereto. Merely by doing so, each mating pair of terminals can be easily electrically connected together.

The mounted part, electrically connected to the connector 10, is not limited to the electromagnetic relay 20, but may be any other part such as a transistor and a diode. However, the invention is suited particularly for the wiring of a part, such as a power transistor and a power supply diode, through which a large current flows.

Figure 8:
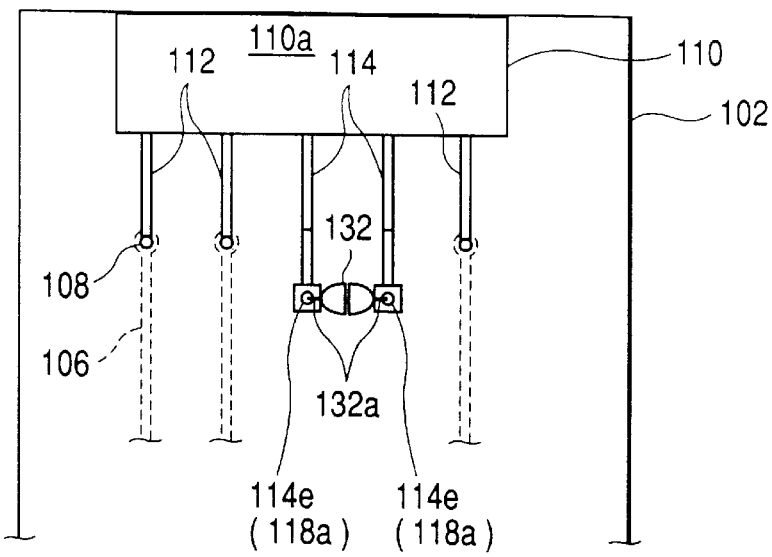
FIG. 8 is a plan view showing a second embodiment of a wiring structure of the invention.
Figure 9:
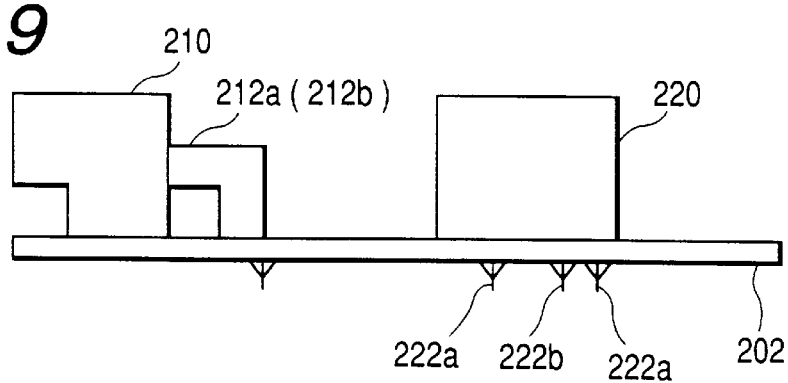
FIG. 9 is a side-elevational view of a conventional wiring structure.

More specifically, in a wiring structure of a second embodiment in which a power supply diode is used as a mounted part, a connector 110 is mounted on a printed circuit board 102, as shown in FIG. 8. Like the above-mentioned connector terminals 12, connector terminals 112, extending from a rear side of a connector body 110a, are passed respectively through through-holes 108 in the printed circuit board 102, and are soldered to wiring patterns 106, thereby forming a circuit, such as a control circuit, through which a small current flows.

On the other hand, connector terminals 114 are similar in construction to the above-mentioned connector terminal 14, and these connector terminals 114 extend along the printed circuit board 102, and through holes 114a, formed respectively through distal end portions thereof, are aligned respectively with through holes 118a, formed through the printed circuit board 102, in overlying manner. Each lead 132a of the power supply diode is passed through the associated mating pair of aligned through holes 114a and 118a, and is soldered thereto. With this arrangement, the power supply diode 132 is electrically connected to the connector terminals 14, thereby forming a circuit, such as a drive circuit, through which a large current flows.

In this case, the power supply diode 132 is fixedly secured by soldering to the printed circuit board 102, and therefore is fixed more firmly. Also, the electrical connection of the connector terminals 114 to the power supply diode is achieved by the arrangement in which the connector terminals 114 are extended respectively to the through holes 118a in the printed circuit board 102, and therefore this electrical connection can be achieved in a more compact manner as compared with the conventional construction of FIG. 10 using the wiring patterns 204. As a result, a space available on the printed circuit board 102 can be effectively used, and besides the degree of freedom of the design is increased.

As described above, in the connector of the present invention, the through holes for respectively passing the lead terminals of the mounted part therethrough are formed respectively through the distal end portions of the connector terminals extending from the connector body. Therefore, the lead terminals of the mounted part are passed respectively through the through holes, formed respectively through the distal end portions of the connector terminals, and are soldered thereto, and by doing so, the lead terminals can be electrically connected to the connector terminals, respectively. Therefore, in contrast with the conventional construction, it is not necessary to increase the width of the wiring patterns on the printed circuit board, and the mating terminals can be electrically connected together in a smaller space.

In the wiring structure of the present invention, the through holes for respectively passing the lead terminals of the mounted part therethrough are formed through the printed circuit board, and the connector terminals of the connector extend respectively to the positions where the through holes in the printed circuit board are located, respectively, and the through holes, formed respectively through the distal end portions of the connector terminals, are aligned respectively with the through holes in the printed circuit board in an overlying manner, and each of the lead terminals is passed through the associated mating pair of aligned through holes, and is soldered thereto, thereby electrically connecting the lead terminal and the connector terminal together. Therefore, in contrast with the conventional construction, it is not necessary to increase the width of the wiring patterns on the printed circuit board, and the mating terminals can be electrically connected together in a smaller space.

What is claimed is:

1. A connector comprising a connector body and at least one connector terminal extending from said connector body, said connector further comprising:

at least one through hole formed at a distal end portion of said connector terminal, into which a lead terminal of an electrical part is passed, the distal end portion being a thin planar member.

2. A connector as claimed in claim 1, wherein a plurality of connector terminals extending from said connector body are provided, each having a through hole at a distal end portion thereof.

3. A connector as claimed in claim 2, wherein said connector terminals are used as power lines of the electrical part.

4. A connector as claimed in claim 1, wherein the connector terminal is formed by blanking a metal sheet, and the distal end portion with the through hole has a thickness substantially equal to a thickness of the metal sheet.

5. A connector as claimed in claim 1, wherein a portion of the connector terminal is connected to the distal end portion and extends substantially coplanar with the distal end portion.

6. A wiring structure for electrically connecting a mounted part and a connector, which are mounted respectively on predetermined portions of a printed circuit board;

wherein through holes for respectively passing lead terminals of said mounted part therethrough are formed through said printed circuit board;

connector terminals of said connector extend respectively to positions where said through holes in said printed circuit board are located, respectively, and through holes, formed respectively through distal end portions of said connector terminals, the distal end portions with the through holes being thin planar members and aligned respectively with said through holes in said printed circuit board in an overlying manner; and each of said lead terminals is passed through the associated mating pair of aligned through holes, and is soldered thereto, thereby electrically connecting said lead terminal and said connector terminal together.

7. A wiring structure as claimed in claim 6, wherein the connector terminal is formed by blanking a metal sheet, and the distal end portion with the through hole has a thickness substantially equal to a thickness of the metal sheet.

8. A wiring structure as claimed in claim 6, wherein a portion of each connector terminal is connected to a respective distal end portion and extends substantially coplanar with the distal end portion.

* * * * *